United States Patent
Klemm et al.

(10) Patent No.: US 11,099,995 B2
(45) Date of Patent: Aug. 24, 2021

(54) TECHNIQUES FOR PREFETCHING DATA TO A FIRST LEVEL OF MEMORY OF A HIERARCHICAL ARRANGEMENT OF MEMORY

(71) Applicant: Intel Corporation, Santa Clara, CA (US)

(72) Inventors: Michael Klemm, Seukendorf (DE); Thomas Willhalm, Sandhausen (DE)

(73) Assignee: Intel Corporation, Santa Clara, CA (US)

( * ) Notice: Subject to any disclaimer, the term of this patent is extended or adjusted under 35 U.S.C. 154(b) by 293 days.

(21) Appl. No.: 15/939,118

(22) Filed: Mar. 28, 2018

(65) Prior Publication Data

US 2019/0042436 A1    Feb. 7, 2019

(51) Int. Cl.
| | |
|---|---|
| *G06F 12/0862* | (2016.01) |
| *G06F 12/0831* | (2016.01) |
| *G06F 12/0811* | (2016.01) |
| *G11C 13/00* | (2006.01) |
| *G11C 11/00* | (2006.01) |
| *G11C 11/401* | (2006.01) |

(52) U.S. Cl.
CPC ...... *G06F 12/0862* (2013.01); *G06F 12/0811* (2013.01); *G06F 12/0835* (2013.01); *G06F 2212/602* (2013.01); *G11C 11/005* (2013.01); *G11C 11/401* (2013.01); *G11C 13/0002* (2013.01); *G11C 13/0004* (2013.01)

(58) Field of Classification Search
None
See application file for complete search history.

(56) References Cited

U.S. PATENT DOCUMENTS

| | | |
|---|---|---|
| 5,912,839 A | 6/1999 | Ovshinsky et al. |
| 6,304,962 B1 | 10/2001 | Nair |
| 6,401,193 B1 | 6/2002 | Afsar |
| 6,412,050 B1 | 6/2002 | Jourdan |
| 6,728,840 B1 | 4/2004 | Shatil |
| 6,988,190 B1 | 1/2006 | Park |
| 7,590,918 B2 | 9/2009 | Parkinson |
| 7,600,078 B1 | 10/2009 | Cen et al. |
| 7,756,053 B2 | 7/2010 | Thomas et al. |
| 7,913,147 B2 | 3/2011 | Swaminathan et al. |

(Continued)

FOREIGN PATENT DOCUMENTS

WO    2014143056 A1    9/2014

OTHER PUBLICATIONS

"Intel Solid-State Drives in Server Storage Applications," White Paper, pp. 1-24 (Feb. 2014).

(Continued)

*Primary Examiner* — Charles Rones
*Assistant Examiner* — Ryan Dare
(74) *Attorney, Agent, or Firm* — Compass IP Law PC

(57) ABSTRACT

Examples include techniques to prefetch data from a second level of memory of a hierarchical arrangement of memory to a second level of memory of the hierarchical arrangement of memory. Examples include circuitry for a processor receiving a prefetch request from a core of the processor to prefetch data from the first level to the second level. The prefetch request indicating an amount of data to prefetch that is greater than a data capacity of a cache line utilized by the core.

22 Claims, 9 Drawing Sheets

(56) References Cited

U.S. PATENT DOCUMENTS

| | | |
|---|---|---|
| 7,971,112 B2 | 6/2011 | Murata |
| 8,051,253 B2 | 11/2011 | Okin et al. |
| 8,225,181 B2 | 7/2012 | Perlmutter |
| 8,364,867 B2 | 1/2013 | Karamcheti et al. |
| 8,386,650 B2 | 2/2013 | Mangold |
| 8,462,537 B2 | 6/2013 | Karpov et al. |
| 8,462,577 B2 | 6/2013 | Zeng et al. |
| 8,463,948 B1 | 6/2013 | Qawami et al. |
| 8,533,550 B2 | 9/2013 | Khan |
| 8,605,531 B2 | 12/2013 | Kau |
| 8,607,089 B2 | 12/2013 | Qawami et al. |
| 8,612,676 B2 | 12/2013 | Dahlen et al. |
| 8,612,809 B2 | 12/2013 | Casper et al. |
| 8,649,212 B2 | 2/2014 | Kau et al. |
| 8,838,935 B2 | 9/2014 | Hinton et al. |
| 8,924,816 B2 | 12/2014 | Khan |
| 9,298,606 B2 | 3/2016 | Ramanujan |
| 9,317,429 B2 | 4/2016 | Ramanujan et al. |
| 9,342,453 B2 | 5/2016 | Nale et al. |
| 9,378,133 B2 | 6/2016 | Nachimuthu et al. |
| 9,430,372 B2 | 8/2016 | Nachimuthu et al. |
| 9,792,224 B2 | 10/2017 | Kumar et al. |
| 10,198,849 B1* | 2/2019 | Ashkar ............... G06T 1/60 |
| 2002/0087800 A1 | 7/2002 | Abdallah |
| 2004/0049639 A1 | 3/2004 | So |
| 2006/0274077 A1 | 12/2006 | Chung |
| 2007/0005922 A1 | 1/2007 | Swaminathan et al. |
| 2007/0220228 A1 | 9/2007 | Huang et al. |
| 2008/0016269 A1 | 1/2008 | Chow et al. |
| 2008/0034148 A1 | 2/2008 | Gower et al. |
| 2008/0270811 A1 | 10/2008 | Chow et al. |
| 2008/0288751 A1 | 11/2008 | Kocev |
| 2009/0006813 A1 | 1/2009 | Singhal |
| 2009/0031078 A1 | 1/2009 | Warnes et al. |
| 2009/0144600 A1 | 6/2009 | Perlmutter |
| 2009/0199056 A1 | 8/2009 | Murata |
| 2009/0313416 A1 | 12/2009 | Nation |
| 2010/0110748 A1 | 5/2010 | Best |
| 2010/0131827 A1 | 5/2010 | Sokolov et al. |
| 2010/0262750 A1 | 10/2010 | Deshpande |
| 2010/0291867 A1 | 11/2010 | Abdulla et al. |
| 2010/0293317 A1 | 11/2010 | Confalonieri et al. |
| 2010/0306446 A1 | 12/2010 | Villa et al. |
| 2010/0306453 A1 | 12/2010 | Doller |
| 2010/0318718 A1 | 12/2010 | Eilert et al. |
| 2011/0153916 A1 | 6/2011 | Chinnaswamy et al. |
| 2011/0208900 A1 | 8/2011 | Schuette et al. |
| 2011/0291884 A1 | 12/2011 | Oh et al. |
| 2012/0254696 A1 | 10/2012 | Perlmutter |
| 2013/0086311 A1 | 4/2013 | Huang et al. |
| 2013/0145085 A1 | 6/2013 | Yu et al. |
| 2013/0268728 A1 | 10/2013 | Ramanujan et al. |
| 2013/0275661 A1 | 10/2013 | Zimmer et al. |
| 2013/0290597 A1 | 10/2013 | Faber |
| 2013/0346703 A1 | 12/2013 | McCauley et al. |
| 2014/0040550 A1 | 2/2014 | Nale et al. |
| 2014/0129767 A1 | 5/2014 | Ramanujan et al. |
| 2014/0281240 A1 | 9/2014 | Willhalm |
| 2014/0297938 A1 | 10/2014 | Puthiyedath et al. |
| 2015/0243335 A1 | 8/2015 | Naeimi et al. |
| 2016/0055088 A1 | 2/2016 | Zhang |
| 2016/0203081 A1* | 7/2016 | Kimura ............ G06F 12/0862 711/125 |
| 2016/0283354 A1 | 9/2016 | Lantz et al. |
| 2016/0378607 A1 | 12/2016 | Kumar et al. |
| 2017/0091104 A1* | 3/2017 | Rafacz ............ G06F 12/0862 |
| 2018/0024932 A1* | 1/2018 | Nachimuthu ......... H04L 43/08 711/213 |
| 2018/0027679 A1* | 1/2018 | Schmisseur ............ G08C 17/02 361/807 |
| 2018/0059966 A1* | 3/2018 | Lee ..................... G06F 3/0631 |

OTHER PUBLICATIONS

"The Non-Volatile Systems Laboratory NV-Heaps: Fast and Safe Persistent Objects", http://nvsl.ucsd.edu/nvuheaps/, 2 pgs., Sep. 1, 2011.

Akel et al., "Onyx: A Prototype Phase Change Memory Storage Array," https://www.flashmemorysummit.com/English/Collaterals/Proceedings/2011/Pr-oceedings.sub.—Chrono.sub.—2011.html, Flash Memory Summit 2011 Proceedings, Aug. 11, 2011.

Bailey et al., "Operating System Implications of Fast, Cheap, Non-Volatile Memory" 13th USENIX, HOTOS11 2011, May 9-11, 2011, 5 pages.

Caulfield et al., "Moneta: A High-performance Storage Array Architecture for Next-generation, Non-volatile Memories", MICRO 43: Proceedings of the 43rd Annual IEEE/ACM International Symposium on Microarchitecture, Atlanta, GA Dec. 2010 pp. 385-395.

Chen et al., "Rethinking Database Algorithms for Phase Change Memory", 5th Biennial Conference on Innovative Data Systems Research {CIDR '11 }, Jan. 9, 2011, 11 pgs., Asilomar, California, USA.

Clark Jack, Intel: Non-Volatile Memory Shift Means Chips need an Overhaul, ZDNet, http://www.zdnet.com/article/intelnonvolatilememoryshiftmeanschips- needanoverhaul/, pp. 1-8 (Sep. 13, 2012).

Condit et al., "Better I/0 Through Byte-Addressable, Persistent Memory", SOSP '09, Oct. 11, 2009, pp. 133-146. Big Sky, Montana, USA.

Dhiman et al. "PDRAM: A Hybrid PRAM and DRAM Main Memory System", Jul. 26, 2009, Department of Computer Science and Engineering, 6 pages.

Dimitrov, Martin et al., "Combining Local and Global History for High Performance Data Prefetching," Journal of Instruction-Level Parallelism 13, pp. 1-14 (2011).

Freitas et al., "Storage-class memory: The next storage system technology", IBM J. Res. & Dev., Jul./Sep. 2008, pp. 439-447, vol. 52, No. 4/5.

Giles, et al., "Bridging the Programming Gap between Persistent and Volatile Memory using WrAP," Proceedings of the ACM International Conference on Computing Frontiers, p. 30 (2013).

Halfacree, Gareth, "Intel Pledges 2016 Launch for 3D XPoint-Based Optane," 2pgs, accessed at http://www.bit-tech.net/news/hardware/2015/08/19/intel-optane/1/ on Aug. 27, 2015.

Hockmuth, "Phase Change Memory-Based 'Moneta' System Points to the Future of Computer Storage," http://ucsdnews.ucsd.edu/archive/newsrel/science/06-02-11data.sub.—front- ier.asp, 2 pages, accessed May 19, 2017, Jun. 2, 2011.

Jacob, "The Memory System You Can't Avoid It, You Can't Ignore It, You Can't Fake It," Morgan & Claypool, Synthesis Lectures on Computer Architecture, vol. 4, No. 1, pp. 1-77, Jun. 2009.

Kant, Dr. Krishna, "Exploiting NVRAM for Building Multi-Level Memory Systems", InternationalWorkshop on Operating System Technologies for Large Scale NVRAM, Oct. 21, 2008, Jeju, Korea, 19 pages.

Lawson, Stephen, "Intel, Micron Claim a New Class of Memory between Flash and DRAM," CIO, pp. 1-4, accessed at http://www.cio.com/article/2953753/intel-micron-claim-a-new-class-of-memo- ry-between-f . . . / on Aug. 27, 2015.

Lee et al., "Architecting Phase Change Memory as a Scalable DRAM Alternative", ISCA '09 Proceedings of the 36th Annual International Symposium on Computer Architecture, pp. 2-13, Jun. 20-24, 2009.

Mearian, "IBM announces computer memory breakthrough Phase-change memory offers 100 times the write performance of NANO flash", Jun. 30, 2011, 3 pgs.

Microsoft, "Computer Dictionary", Fifth Edition, p. 223, 2002.

Mogul et al., "Operating System Support for NVM+DRAM Hybrid Main Memory", 12th Workshop on Hot Topics in Operating Systems {HatOS XII), May 18, 2009, 9 pgs.

(56) References Cited

OTHER PUBLICATIONS

Morrow, "Checksum vs. Torn Page Detection," http://colleenmorrow.com/2012/06/07/page.sub.—verify-checksum-vs-torn-pa- ge-detection/, 4 pages, accessed May 19, 2017, Jun. 7, 2012.

Nesbit, Kyle J. et al., "Data Cache Prefetching using a Global History Buffer," Proceedings of the 10th International Symposium on High Performance Computer Architecture (HPCA '04), pp. 96-96 (2004).

Office Action for U.S. Appl. No. 14/921,809, dated Mar. 24, 2017, 5 pages.

Office Action for U.S. Appl. No. 15/784,625, dated Feb. 9, 2018, 5 pages.

Prout, "The Story Behind MemSQL's Skiplist Indexes," MEMSQL Blog, http://blog.memsql.com/the-story-behind-memsqls-skiplist-indexes/, 6 pages, Jan. 20, 2014.

Quereshi et al., "Scalable High Performance Main Memory System Using Phase-Change Memory Technology", ISCA '09, Jun. 20, 2009, 10 pgs., Austin, Texas, USA.

Raoux et al., "Phase-Change Random Access Memory: A Scalable Technology," IBM Journal of Research and Development, vol. 52, Issue 4, pp. 465-479, Jul. 2008.

Rouse, "Object Code," http://whatis.techtarget.com/definition/object-code,WhatIs.com, TechTarget, 1 page, accessed May 19, 2017, Sep. 2005.

The Non-Volatile Systems Laboratory, "ECC and Data Coding for Non-Volatile Memories," http://nvsl.ucsd.edu/ecc, 3 pages, accessed May 19, 2017, May 25, 2012.

The Non-Volatile Systems Laboratory, "Moneta and Onyx: Very Fast SSDs," https://web.archive.org/web/20110429170453/http://nvsl.ucsd.edu:80/moneta- /, 2 pages, Feb. 20, 2011.

The Notification of Transmittal of the International Search Report and the Written Opinion for Related PCT/US2016/031613, dated Aug. 19, 2016.

Webopedia, "FPGA", web.archive.org/web/20021001203456/http://www.webopedia.com/term/f/fpga.h- tml, 2 pages, retrieved May 10, 2017, dated Oct. 30, 2001.

Wu et al., "eNVy: A Non-Volatile, Main Memory Storage System," ASPLOS VI Proceedings of the Sixth International Conference on Architectural Support for Programming Languages and Operating Systems, 12 pages, Oct. 1994.

U.S. Appl. No. 15/375,675, filed Dec. 12, 2016, 65 pages.
U.S. Appl. No. 15/376,447, filed Dec. 12, 2016, 52 pages.
U.S. Appl. No. 15/382,103, filed Dec. 16, 2016, 41 pages.
U.S. Appl. No. 15/476,866, filed Mar. 31, 2017, 42 pages.
U.S. Appl. No. 15/640,283, filed Jun. 30, 2017, 32 pages.

\* cited by examiner

**Cache Line Prefetch Request Format
210**

| Header Information 212 | Address Information 214 |
|---|---|

**Bulk Prefetch Request Format
220**

| Header Information 222 | Address Information 224 | Data Amount 226 |
|---|---|---|

RECEIVE, AT CIRCUITRY FOR A PROCESSOR, A PREFETCH REQUEST FROM A CORE OF THE PROCESSOR, THE PREFETCH REQUEST TO PREFETCH DATA FROM A SECOND LEVEL OF MEMORY INCLUDED IN A HIERARCHICAL ARRANGEMENT OF MEMORY COUPLED WITH THE PROCESSOR, THE DATA TO BE PREFETCHED TO A FIRST LEVEL OF MEMORY INCLUDED IN THE HIERARCHICAL ARRANGEMENT OF MEMORY, THE PREFETCH REQUEST TO INDICATE AN AMOUNT OF DATA TO PREFETCH THAT IS GREATER THAN A DATA CAPACITY OF A CACHE LINE UTILIZED BY THE CORE
702

SEND AN ACKNOWLEDGEMENT TO THE CORE TO INDICATE RECEIPT OF THE PREFETCH REQUEST
704

SEND ONE OR MORE ACCESS REQUESTS TO A CONTROLLER OF THE SECOND LEVEL OF MEMORY TO CAUSE THE DATA INDICATED IN THE PREFETCH REQUEST TO BE STORED TO THE FIRST LEVEL OF MEMORY
706

*FIG. 7*

Storage Medium 800

*Computer Executable Instructions for 700*

*FIG. 8*

TECHNIQUES FOR PREFETCHING DATA TO A FIRST LEVEL OF MEMORY OF A HIERARCHICAL ARRANGEMENT OF MEMORY

TECHNICAL FIELD

Examples described herein are generally related to prefetching data to a first level of memory of a hierarchical arrangement of memory. The first level of memory may be referred to as a near memory.

BACKGROUND

Computing platforms or systems may include circuitry such as a central processing unit (CPU) arranged to execute instruction sequences associated with applications or programs. These instruction sequences along with data operated on by CPU's execution of the instructions sequences may be at least temporarily stored in various layers of a memory system that may include multiple on-die CPU caches and a main memory. The instruction sequences and/or data may be retrieved from the main or system memory as needed by the CPU.

A memory system having multiple on-die CPU caches may include a last-level cache (LLC) having a fast access/low latency type of memory (e.g., static random access memory (SRAM)). The main memory may include a hierarchical arrangement of memory having two levels of memory (alternatively referred to as "2LM"). The first level of main memory may serve as a memory-side cache for a second level of main memory. The first level of main memory may be referred to as "near memory" and may include types of memory that have relatively slower access/higher latency compared to memory included in LLCs. The second level of main memory may be referred to as "far memory" and may include types of memory that have relatively slower access/higher latency compared to memory included in the near memory. Typically, a far memory has a larger memory capacity than near memory and near memory has a substantially larger memory capacity than the on-die CPU caches.

BRIEF DESCRIPTION OF THE DRAWINGS

FIG. 2 illustrate an example formats for prefetch requests.
FIG. 7 illustrates an example of a logic flow.
FIG. 8 illustrates an example of a storage medium.

DETAILED DESCRIPTION

Operating speeds of CPUs have increased at a rate that has not been matched by similar increases in memory access times. As a result, memory may be a significant performance bottleneck for a computing platform. One way to reduce impacts of these performance bottlenecks is to increase memory capacities for on-die CPU caches such as LLCs that include fast access/low latency types of memory such as SRAM. However, costs for SRAM may be unacceptably high and on-die space needed for these memory capacities may not be available if only large increases in memory capacities for LLCs were used to address performance bottle necks.

One way to address cost or available space issues is to utilize intermediate memory-side caches situated between an LLC and a large portion of main memory. These memory-side caches may be composed of less expensive types of memory and may serve as near memory in a 2LM memory system and the far memory may serve as a largest portion of main memory. Examples of near memory may include dynamic random access memory (DRAM) arranged as high-bandwidth memory (HBM), embedded DRAM (eDRAM) or DRAM-based caches for types of non-volatile memory. These types of near memory all have substantially higher memory capacities than LLCs (e.g., at least 1,000 times greater) and thus can maintain a large amount of cache data pulled from far memory compared to cache data pulled to the LLCs from either far or near memory.

In some examples, if a program or applications being executed by a CPU enters a new phase or starts working on a part of a data set stored to far memory, it may advantageous to prefetch data to types of near memory having a substantially higher memory capacity than an LLC. Current prefetch techniques include the CPU sending prefetch instructions to cause data to be pulled to the near memory through an LLC. Each prefetch instruction may only pull a single cache line that has a relatively small memory size or capacity (e.g., 64 bytes). Near memory may have a capacity to hold multiple gigabytes (GBs) of cache data. Therefore, millions of prefetch instructions may be needed to prefetch potentially GBs of data to a near memory using current types of prefetch instructions. Millions of prefetch instructions issued by a CPU would result in significant CPU overhead and may also cause unwanted or inefficient cache evictions for data maintained on-die CPU caches. It is with respect to these challenges that the examples described herein are needed.

Figure 1:
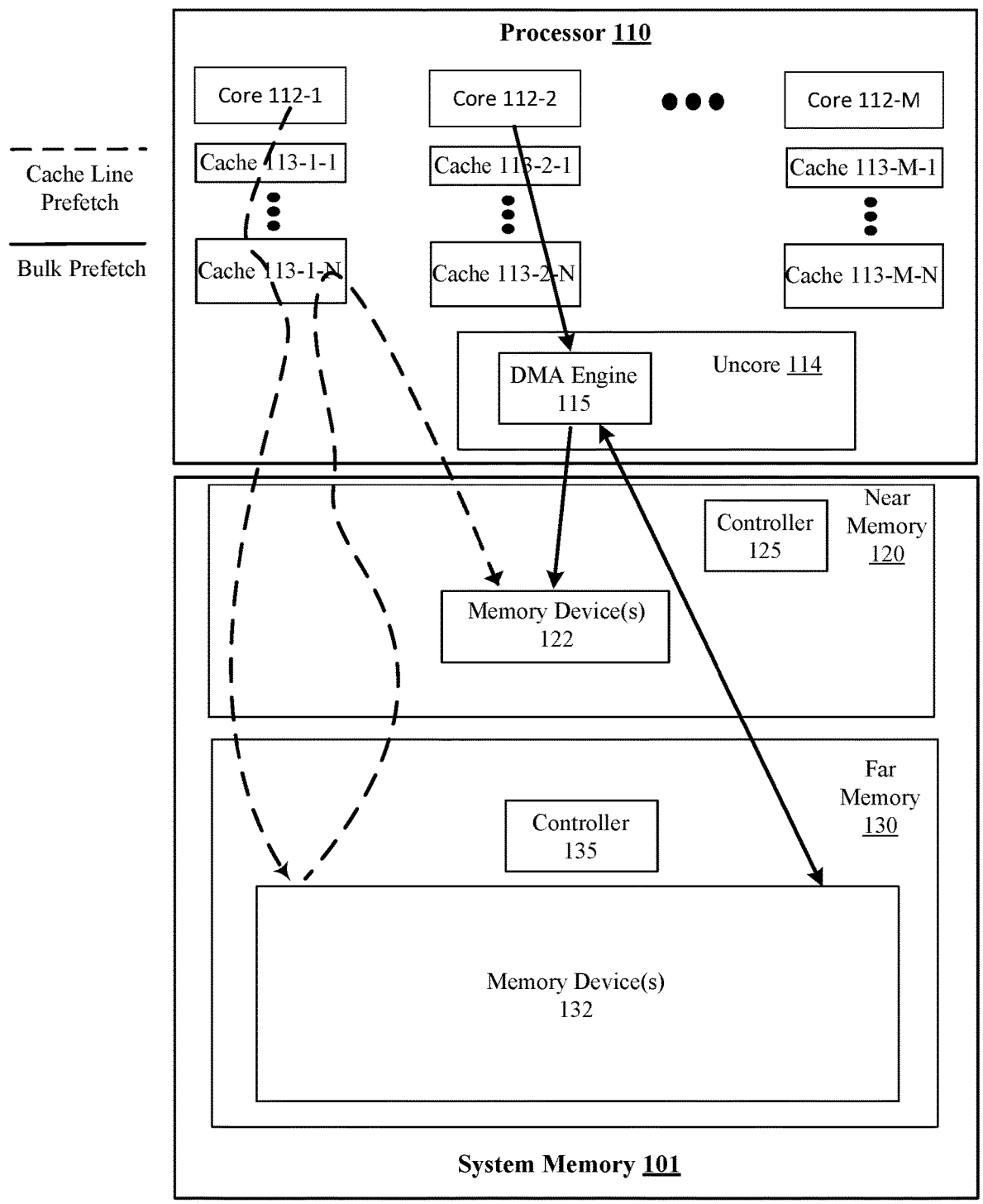
FIG. 1 illustrates an example system.

FIG. 1 illustrates an example system 100. In some examples, system 100 may be part of a computing platform or system that, as shown in FIG. 1, may include a processor 110, and a system memory 101. For these examples, the computing platform may include, but is not limited to, a server, a server array or server farm, a web server, a network server, an Internet server, a work station, a mini-computer, a main frame computer, a supercomputer, a network appliance, a web appliance, a desk top computer, a laptop computer, a notebook computer, a handheld computing device, a distributed computing system, multiprocessor systems, processor-based systems, or combination thereof.

According to some examples, as shown in FIG. 1, processor 110 may include cores 112-1 to 112-M, where "M" represents any whole positive value >2 (although in other examples processor 110 may include a single core or 2 cores). Cores 112-1 to 112-M may separately include respective multi-level caches. For example, core 112-1 may include caches 113-1-1 to 113-1-N, where "N" represents any whole positive value >1. In some examples, the last level of caches 113-1-1 to 113-1-N, such as cache 113-1-N may be referred to as a last level cache (LLC) for core 112-1. The multi-level caches for each core of cores 112-1 to 112-M may include types of memory having fast access/low latency such as, but not limited to, SRAM. Also, these multi-level caches may be located on a same die or package as their respective cores.

In some examples, as shown in FIG. 1, system memory 101 may be a 2LM memory system. For these examples, system memory 101 may have a hierarchical arrangement that includes a near memory 120 as a first level of system memory 101 and a far memory 130 as a second level of system memory 101. Near memory 120 may include a controller 125 and one or more memory devices and/or dies 122. Far memory 130 may include a controller 135 and one or more memory devices and/or dies 132.

According to some examples, memory device(s) 122 included in near memory 120 may include types of memory that have slower access times or higher latency compared to types of memory included in the multi-level caches associated with cores 112-1 to 112-M of processor 110. For example, memory device(s) 122 may include volatile types of memory that typically have slow access times or high latency compared to SRAM such as, but not limited to, DRAM. The DRAM, for example, may be deployed as high-bandwidth memory (HBM) stacked on or near processor 110 (e.g., included on a same circuit board or package), embedded DRAM with processor 110 (e.g., include on a same circuit board or package) or included in one or more dual in-line memory modules (DIMMs) coupled with processor 110. Also, memory device(s) 122 may have a memory capacity that may be multiple GBs. Meanwhile memory capacities for individual caches on processor 110 may be only a few megabytes (MBs) or less.

In some examples, memory device(s) 132 included in far memory 130 may include types of memory that have slower access times or higher latency compared to types of memory included in memory device(s) 122 of near memory 120. For example, memory device(s) 132 may include types of memory that typically have slower access times or higher latency compared to the types of memory included in memory device(s) 122. Also, memory device(s) 132 may have a memory capacity that may be substantially higher than the memory capacity of memory device(s) 122. For example, multiple terabytes (TBs). Types of memory included in memory device(s) 132 may include, but are not limited to, byte or block addressable types of non-volatile memory having a 3-dimensional (3-D) cross-point memory structure that includes, but is not limited to, chalcogenide phase change material (e.g., chalcogenide glass) hereinafter referred to as "3-D cross-point memory". Non-volatile types of memory may also include other types of byte or block addressable non-volatile memory such as, but not limited to, multi-threshold level NAND flash memory, NOR flash memory, single or multi-level phase change memory (PCM), resistive memory, nanowire memory, ferroelectric transistor random access memory (FeTRAM), anti-ferroelectric memory, resistive memory including a metal oxide base, an oxygen vacancy base and a conductive bridge random access memory (CB-RAM), a spintronic magnetic junction memory, a magnetic tunneling junction (MTJ) memory, a domain wall (DW) and spin orbit transfer (SOT) memory, a thyristor based memory, a magnetoresistive random access memory (MRAM) that incorporates memristor technology, spin transfer torque MRAM (STT-MRAM), or a combination of any of the above.

According to some examples, near memory 120 may serve as a memory-side cache for elements of processor 110 to cache data that may be prefetched from far memory 130. The use of near memory 120 as a memory-side cache that includes a faster memory type compared to slower/longer latency memory types in far memory 130 may address potential performance issues associated with the slower/longer latency overhead in accessing data from far memory 130. Also, the types of memory included in memory device(s) 132 may have advantages of a higher density, lower cost and higher memory capacity. A balance between performance, cost and memory capacity may be obtained by using a 2LM memory system having memory device(s) 122 in near memory 120 and memory device(s) 132 in far memory 130 with the respective types of memory described above for these memory devices. One method to improve performance is by prefetching data stored in far memory 130 to near memory 120. Prefetching may refer to transferring data stored in one memory location of a memory hierarchy to a higher-level memory location that is closer to processor 110. For example, prefetching may refer to an early retrieval of data from memory device(s) 132 of far memory 130 to memory device(s) 122 of near memory 120 before processor 110 issues a request or demand for the specific data that was transferred.

In some examples, processor 110 may include or may be used in connection with a direct memory access (DMA) circuitry 115. For these examples, DMA circuitry 115 may be located in an uncore portion of processor 110 that is shown in FIG. 1 as uncore 114. According to some examples, DMA circuitry 115 may be arranged as an intellectual property (IP) block that includes one or more programmable blocks or modules of logic such as one or more field programmable gate arrays (FPGAs) or application specific integrated circuits (ASICs) arranged to support DMA to system memory 101 for cores 112-1 to 112-M. Although not shown in FIG. 1, uncore 114 may also include one or more additional IP blocks to support cores 112-1 to 112-M. For example, support that may include such functions as, but not limited to, serving as a quick path interconnect (QPI) controller, an on-die memory controller, or a snoop agent pipeline.

According to some examples, as described in more detail below, DMA circuitry 115 may include logic and/or features to receive bulk prefetch requests from cores 112-1 to 112-M that cause DMA circuitry 115 to generate one or more access requests to far memory 130 to prefetch data from memory device(s) 132 to transfer the data to memory device(s) 122 of near memory 120. For these examples, the solid-lined arrows depict a flow of communications/actions for a bulk prefetch request submitted by core 112-2. The bulk prefetch request may enable core 112-2 to cause a substantially larger amount of data to be prefetched from a single bulk prefetch request compared to a single cache line prefetch request. For example, a single bulk prefetch request may result in 100's of MBs of data being prefetched from memory device(s) 132 of far memory 130 and transferred to memory device(s) 122 of near memory 120.

In comparison to a bulk prefetch request, a relatively low amount of data may be transferred responsive to a single cache line prefetch request (e.g., 64 bytes). An unacceptably high processor overhead may result when processing potentially millions of cache line prefetch requests to transfer the 100's of MBs of data from far memory 130 to near memory 120 to match what can be accomplished with a single bulk prefetch request. The dash-lined arrows in FIG. 1 show an example of a single cache line prefetch request from core 112-1 that may require data to go through LLC cache 113-1-N before being transferred to memory device(s) 122. Also, on top of unacceptably high processing overhead, some caches (e.g., LLCs) associated with cores prefetching 100's of MBs of data may be quickly overloaded as a multitude of single cache line prefetches may lead to frequent evictions of data maintained at least in caches 113-1-1 to 113-3-N. Frequent evictions of the data may cause these on-die caches to have lower locality for data needed for processing by core 112-1. Both challenges of high processing overhead and on-die cache overloading may negate advantages of using near memory 120 as a memory-side cache to store data prefetched from far memory 130.

According to some examples, cores 112-1 to 112-M and/or DMA circuitry 115 may communicate with controller 125 and/or access memory device(s) 122 of near memory 120 through one or more input/output (I/O) interfaces (not shown). These I/O interfaces coupled with elements of near memory 120 may be designed to operate in accordance with various memory technologies. The various memory technologies may include, but are not limited to, DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), HBM2, version 2, JESD235A, originally published by JEDEC in January 2016, and/or other technologies based on derivatives or extensions of such specifications. The various memory technologies may also include memory technologies currently in development that may include, but are not limited to, DDR5 (DDR version 5, currently in discussion by JEDEC), LPDDR5 (LPDDR version 5, currently in discussion by JEDEC), HBM3 (HBM version 3, currently in discussion by JEDEC), and/or other new technologies based on derivatives or extensions of these developing memory technologies.

In some examples, cores 112-1 to 112-M and/or DMA circuitry 115 may also communicate with controller 135 and/or access memory device(s) 132 of far memory 130 through one or more I/O interfaces (not shown). These I/O interfaces coupled with elements of far memory 130 may include at least one I/O interface arranged as a Peripheral Component Interconnect Express (PCIe) interface to couple cores 112-1 to 112-M and/or DMA circuitry 115 to elements of far memory 130. These I/O interfaces may also include at least one I/O interface arranged as a Non-Volatile Memory Express (NVMe) interface to couple cores 112-1 to 112-M and/or DMA circuitry 115 to elements of far memory 130. Communication protocols utilized to communicate through these I/O interfaces may be as described in industry standards or specifications (including progenies or variants) such as the Peripheral Component Interconnect (PCI) Express Base Specification, revision 4.0, version 1.0, published in October 2017 ("PCI Express specification" or "PCIe specification") and/or the Non-Volatile Memory Express (NVMe) Specification, revision 1.3a, published in October 2017 ("NVMe specification"). Although PCIe or NVMe interfaces may typically involve block storage of data, in some examples, data structures or files stored to memory device(s) 132 of far memory 130 may be paged in to these memory devices when accessed by cores 112-1 to 112-M and/or DMA circuitry 115.

In some examples, processor 110 may represent, either individually or collectively, various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon® or Xeon Phi® processors; and similar processors.

FIG. 2 illustrates an example formats for prefetch requests. In some examples, as shown in FIG. 2, the example formats include a cache line prefetch request format 210 and a bulk prefetch request format 220. For these examples, cache line prefetch request format 210 or bulk prefetch request format 220 may be sent by elements of a processor (e.g., cores 112-1 to 112-M of processor 110) to DMA circuitry of the processor (e.g., DMA circuitry 115) to prefetch data from a second level of a system memory (e.g., far memory 130 of system memory 101) to a first level of the system memory (e.g., near memory 120).

According to some examples, as shown in FIG. 2, cache line prefetch request format 210 includes header information 212 and address information 214. Header information 212 may include information to assistant in tracking and/or identifying individual cache line prefetch requests. Address information 214 may include a base address in the far memory for which data is to be transferred to a near memory. In some examples, an amount of data transferred from the base address may be a fixed amount based on cache line size such as a 64-byte cache line size. Examples are not limited to a 64-byte cache line size. However, the cache line size is likely to be substantially smaller than a capacity of the near memory. Hence, prefetching even a few MBs of data from the far memory would require requesting cores to send 1,000's of cache line prefetch requests.

In some examples, as shown in FIG. 2, bulk prefetch request format 220 includes header information 222, address information 224 and data amount 226. Header information 222 may include information to assistant in tracking and/or identifying individual bulk prefetch requests. Address information 224 may include a base address in the far memory for which data is to be prefetched and then transferred to a near memory. Data amount 226 may indicate an amount of data to be prefetched from the far memory. The amount of data, for example, may vary to match an amount of total data to be prefetched. The total data may be 100's of MBs to several GBs in size. The amount of data indicated in data amount 226 allows cores issuing a bulk prefetch request in example bulk refresh to send a single bulk prefetch request using example bulk prefetch request format 220, receive an acknowledgement response for the DMA that the bulk prefetch request was received and then move on to other activities. The DMA circuitry receiving the bulk prefetch request in the example bulk prefetch request format 220 may then proceed to prefetch data from the far memory. In some examples, multiple access requests may be made by the DMA circuitry to the far memory to prefetch the data. In other words, the amount indicated in data amount 226 is not restricted by data size limitations on per access requests made by the DMA circuitry to prefetch data from the far memory. For example, data payload sizes for access requests set for I/O interfaces using PCIe or NVMe protocols to access data from the far memory.

Figure 3:
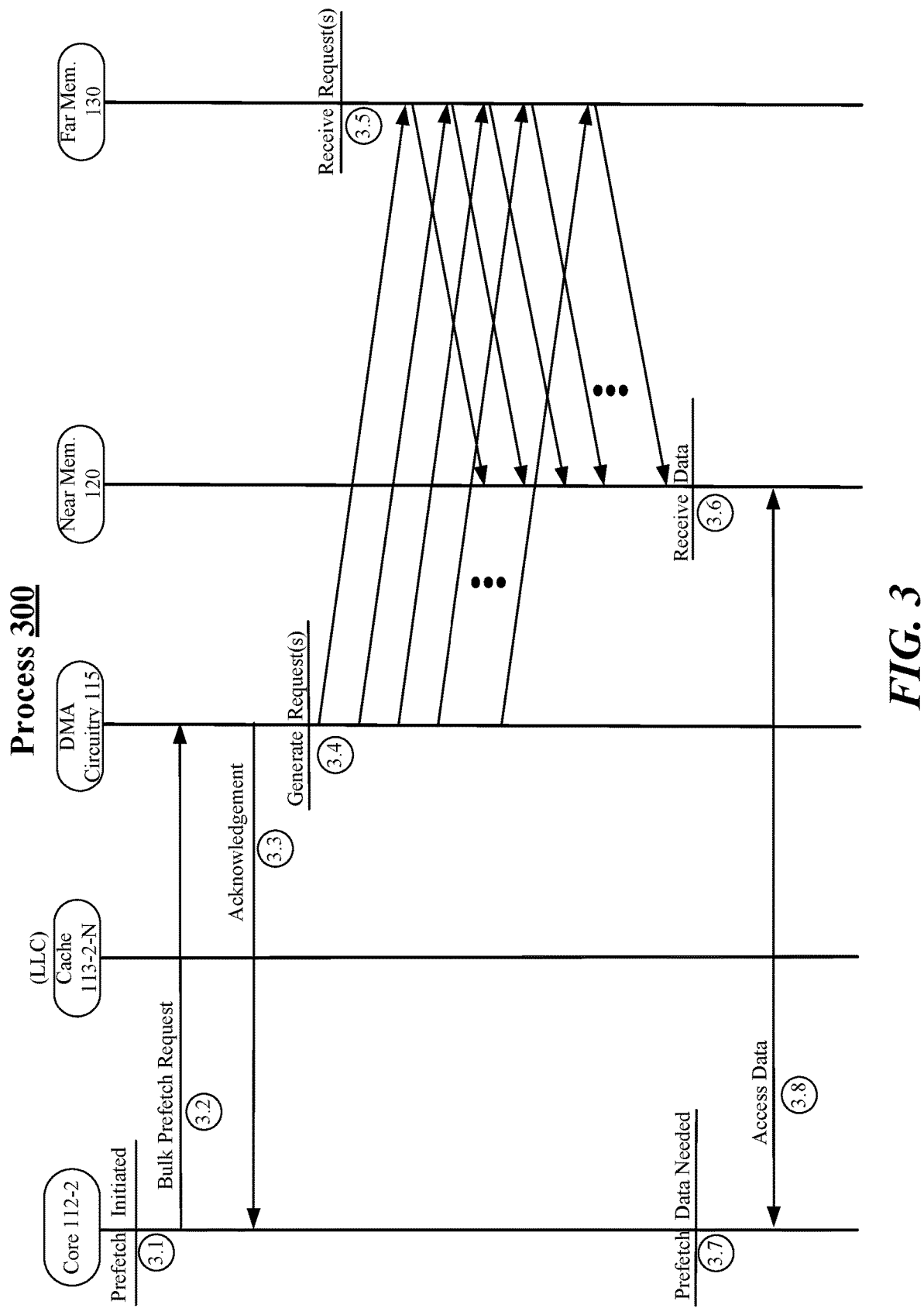
FIG. 3 illustrates an example first process.

FIG. 3 illustrates an example process 300. In some examples, process 300 may be an example process of how logic and/or features of a DMA circuitry may receive a bulk prefetch request from elements of a processor (e.g., cores) to prefetch data from a far memory to a near memory of a hierarchical system memory and then prefetch data from the far memory responsive to receiving the bulk prefetch request. For these examples, elements of system 100 as shown in FIG. 1 may be related to process 300. These elements of system 100 may include, but are not limited to, core 112-2, cache 113-2-N, DMA circuitry 115, near memory 120 or far memory 130. Also, example bulk prefetch request format 220, as shown in FIG. 2, may be related to process 300.

Beginning at process 3.1, core 112-2 may detect that a prefetch was initiated. In some examples, detection of a prefetch may be based on one or more prefetching schemes that may predict or anticipate a need for data stored in far memory 130 by an application or program being executed by core 112-2. For example, prediction or anticipation of a need for data stored in far memory 130 may be based on the application or program entering a new phase of operation or switching to work on a different data set that is currently stored in far memory 130. Core 112-2 may also detect a prefetch responsive to receiving instructions such as a "bulk prefetch" instruction that may cause a bulk prefetch of data from far memory 130 to near memory 120. A bulk prefetch instruction, for example, may be issued by the application or program to indicate entering a new phase or switching to work on a different data set. The bulk prefetch instruction may be issued/caused through an instruction/runtime interface available to the application or program.

Moving to process 3.2, core 112-2 may send a bulk prefetch request to DMA circuitry 115 using the example bulk prefetch request format 220. In some examples, the bulk prefetch request using the example bulk prefetch request format 220 may indicate a base address in far memory 130 via which data is to be prefetched and a size of data to be prefetched (e.g., 500 MBs).

Moving to process 3.3, logic and/or features of DMA circuitry 115 may receive the bulk prefetch request and generate an acknowledgement message that the bulk prefetch request was received. According to some examples, identification information included in header information 222 of a bulk prefetch request in example bulk prefetch request format 220 may be included in the acknowledgement message to indicate to core 112-2 what particular bulk prefetch request is being acknowledged as being received. In other examples, an acknowledgement message is not sent. For these other examples, core 112-1 may assume that the bulk prefetch request is received and expect the data to be prefetched in bulk from far memory 130. Core 112-2 may determine that the bulk prefetch was not received when it later tries to access the prefetch data from near memory 120 and does not find the data that was indicated in bulk prefetch request sent to DMA circuitry 155 at process 3.2.

Moving to process 3.4, logic and/or features at DMA circuitry 115 may generate one or more memory access requests to far memory 130 to prefetch the data indicated in the received bulk prefetch request. In some examples, if the amount of data to be prefetched is larger than individual data payload size limits for access requests for I/O protocols used to access far memory 130, multiple requests may be made by DMA circuitry 115.

Moving to process 3.5, far memory 130 may receive the one or more access requests from DMA circuitry 115. According to some examples, logic and/or features at far memory 130 such as controller 135 may receive and process the requests to access data stored to memory device(s) 122.

Moving to process 3.6, near memory 120 may receive the data prefetched from far memory 130 in response to the one or more access requests sent to far memory 130 by DMA circuitry 115. In some examples, logic and/or features at near memory 120 such as controller 125 may cause the prefetched data to be stored to memory device(s) 122 of near memory 120.

Moving to process 3.7, core 112-2 may determine that the prefetch data is needed. For example, the software or program has begun to work on the data prefetched to near memory 120.

Moving to process 3.8, core 112-2 may access the data from near memory 120. Process 300 may then come to an end.

Figure 4:
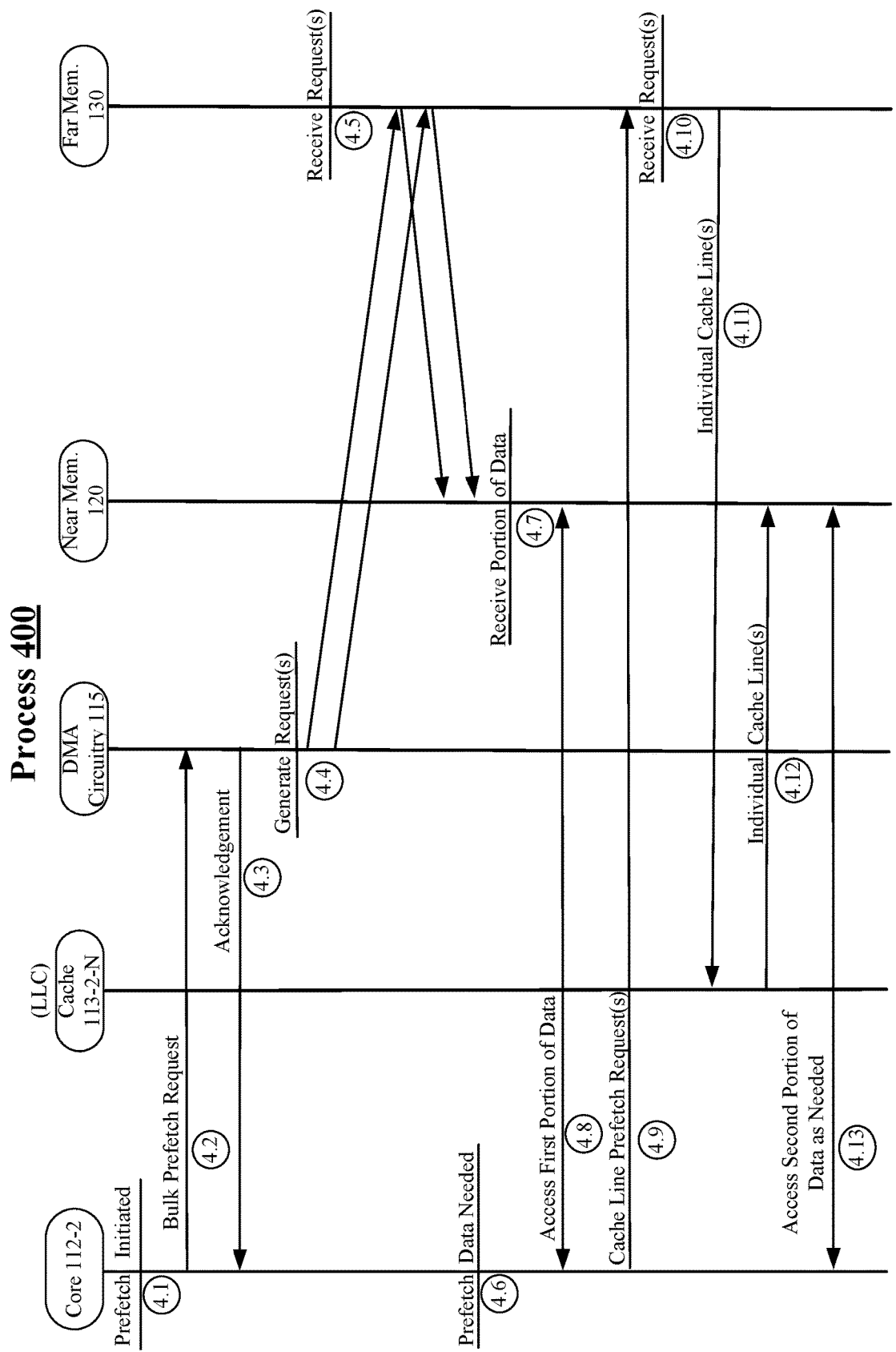
FIG. 4 illustrates an example second process.

FIG. 4 illustrates an example process 400. In some examples, process 400 may be an example process of how logic and/or features of a DMA circuitry may receive a bulk prefetch request from elements of a processor (e.g., cores) to prefetch data from a far memory to a near memory of hierarchical system memory and then prefetch at least a first portion of data from the far memory responsive to receiving the bulk prefetch request. Process 400 differs from process 300 in that data included in the bulk prefetch request may be needed before all the data was prefetched to near memory 120. For these examples, elements of system 100 as shown in FIG. 1 may be related to process 400. These elements of system 100 may include, but are not limited to, core 112-2, cache 113-2-N, DMA circuitry 115, near memory 120 or far memory 130. Also, example bulk prefetch request format 220 and example cache line prefetch request format 210, as shown in FIG. 2, may be related to process 400.

Beginning at process 4.1, core 112-2 may detect that a prefetch was initiated.

Moving to process 4.2, core 112-2 may send a bulk prefetch request to DMA circuitry 115 using the example bulk prefetch request format 220. In some examples, the bulk prefetch request using the example bulk prefetch request format 220 may indicate a base address in far memory 130 via which data is to be prefetched and a size of data to be prefetched (e.g., 500 MBs).

Moving to process 4.3, logic and/or features of DMA circuitry 115 may receive the bulk prefetch request and generate an acknowledgement message that the bulk prefetch request was received. In other examples, an acknowledgement message is not sent for similar reasons as those mentioned for process 300 at process 3.3.

Moving to process 4.4, logic and/or features at DMA circuitry 115 may generate one or more memory access requests to far memory 130 to prefetch the data indicated in the received bulk prefetch request.

Moving to process 4.5, far memory 130 may receive the one or more access requests from DMA circuitry 115.

Moving to process 4.6, core 112-2 may determine that the prefetch data is needed. However, only a first portion of the data indicated in the bulk prefetch request may have been received in near memory 120.

Moving to process 4.7, only a first portion of the data indicated in the bulk prefetch request has been received in near memory 120. In some examples, only a first portion of the data being received may be due to congestion issues in system memory 101 or may be due to the software or program needing the data quicker than predicted or anticipated. In some examples, DMA circuitry 115 may continue to prefetch data indicated in the batch prefetch request from far memory 130. In other examples, DMA circuitry 115 may receive an indication from core 112-2 that the prefetch data is needed for processing. Responsive to the indication, logic and/or features of DMA circuitry 115 may stop generating and sending requests to access remaining data from far memory 130.

Moving to process 4.8, core 112-2 may access the first portion of data in near memory 120.

Moving to process 4.9, core 112-2 may determine what remaining data is needed and then sends one or more cache line prefetch requests to far memory 130 to prefetch the remaining amount of data on an as needed basis. The one or more cache line prefetch requests may be in example cache line prefetch request format 210.

Moving to process 4.10, far memory 130 may receive the one or more cache line prefetch requests to prefetch data from far memory 130.

Moving to process 4.11, individual cache line(s) of data may be sent to cache 113-2-N at processor 110 from far memory 130.

Moving to process 4.12, the individual cache line(s) of data may be then transferred from cache 113-2-N to near memory 120.

Moving to process 4.13, core 112-2 may access the second portion of data from near memory 120 on an as needed basis and/or when needed data included in the second data portion has been prefetched to near memory 120. Process 400 then comes to an end.

Figure 5:
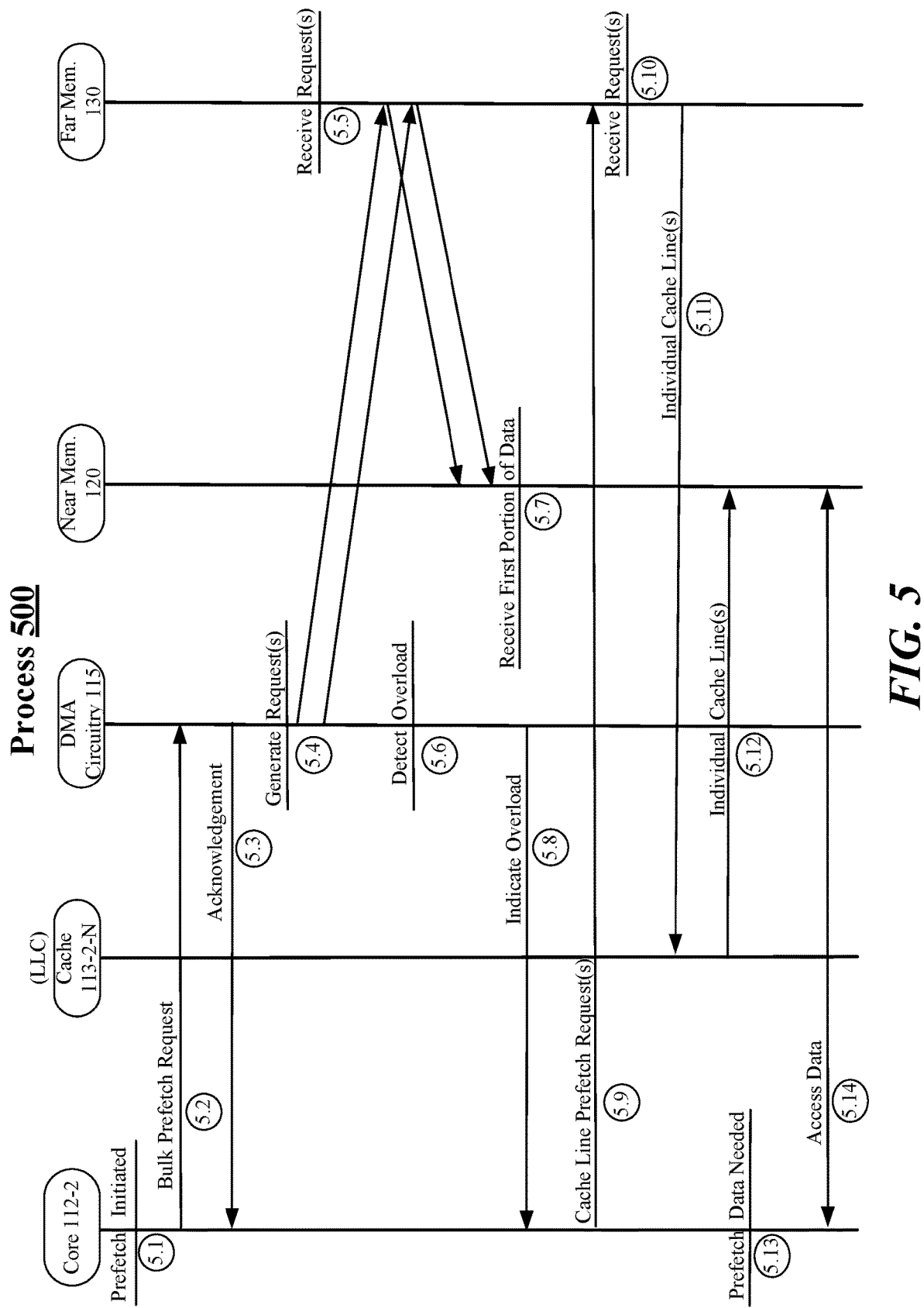
FIG. 5 illustrates an example third process.

FIG. 5 illustrates an example process 500. In some examples, process 500 may be an example process of how logic and/or features of a DMA circuitry may receive a bulk prefetch request from elements of a processor (e.g., cores) to prefetch data from a far memory to a near memory of hierarchical system memory and then prefetch at least a first portion of the data from the far memory responsive to receiving the bulk prefetch request. Process 500 differs from process 300 in that a detected overload in either a DMA circuitry or system memory may cause only a portion of data included in the bulk prefetch request to be prefetched to near memory 120 before the overload was detected. For these examples, elements of system 100 as shown in FIG. 1 may be related to process 500. These elements of system 100 may include, but are not limited to, core 112-2, cache 113-2-N, DMA circuitry 115, near memory 120 or far memory 130. Also, example bulk prefetch request format 220 and example cache line prefetch request format 210, as shown in FIG. 2, may be related to process 500.

Beginning at process 5.1, core 112-2 may detect that a prefetch was initiated.

Moving to process 5.2, core 112-2 may send a bulk prefetch request to DMA circuitry 115 using the example bulk prefetch request format 220. In some examples, the bulk prefetch request using the example bulk prefetch request format 220 may indicate a base address in far memory 130 via which data is to be prefetched and a size of data to be prefetched (e.g., 500 MBs).

Moving to process 5.3, logic and/or features of DMA circuitry 115 may receive the bulk prefetch request and generate an acknowledgement message that the bulk prefetch request was received. In other examples, an acknowledgement message is not sent for similar reasons as those mentioned for process 300 at process 3.3.

Moving to process 5.4, logic and/or features at DMA circuitry 115 may generate one or more memory access requests to far memory 130 to prefetch the data indicated in the received bulk prefetch request.

Moving to process 5.5, far memory 130 may receive the one or more access requests from DMA circuitry 115.

Moving to process 5.6, logic and/or features of DMA circuitry 115 may detect an overload condition. In some examples, DMA circuitry 115 may become overloaded with handling multiple batch prefetch requests from one or more cores 112-1 to 112-M or overloaded due to other transactions requested by cores 112-1 to 112-M. In other examples, system memory 101 may be overloaded and unable to fulfill access requests to prefetch at least a portion of the data indicated in the bulk prefetch request. The overload of system memory 101 may be at either near memory 120 or far memory 130. Controller 125 or controller 135 may send overload information to DMA circuitry 115 that indicates an overload condition in respective near memory 120 or far memory 130.

Moving to process 5.7, only a first portion of the data indicated in the bulk prefetch request has been received in near memory 120.

Moving to process 5.8, logic and/or features of DMA circuitry 115 may indicate the overload condition to core 112-2. In some examples, this indication may indicate the amount of data prefetched from far memory 130 before the overload was detected or occurred. In other examples, DMA circuitry may not send an indication of an overload condition. For these other examples, Core 112-2 may determine that all of the data indicated in bulk prefetch was not received when it later tries to access the prefetch data from near memory 120 and does not find all the data that was indicated in bulk prefetch request sent to DMA circuitry 155 at process 4.2.

Moving to process 5.9, core 112-2 may determine what remaining data is needed and then sends one or more cache line prefetch requests to far memory 130 to prefetch the remaining amount of data. The one or more cache line prefetch requests may be in example cache line prefetch request format 210.

Moving to process 5.10, far memory 130 may receive the one or more cache line prefetch requests to prefetch data from far memory 130.

Moving to process 5.11, individual cache line(s) of data may be sent to cache 113-N at processor 110 from far memory 130.

Moving to process 5.12, the individual cache line(s) of data may be then transferred from cache 113-2 to near memory 120.

Moving to process 5.13, core 112-2 may determine that the prefetch data is needed. For example, the software or program has begun to work on the data prefetched to near memory 120.

Moving to process 5.14, core 112-2 may access the data from near memory 120. Process 500 may then come to an end.

Figure 6:
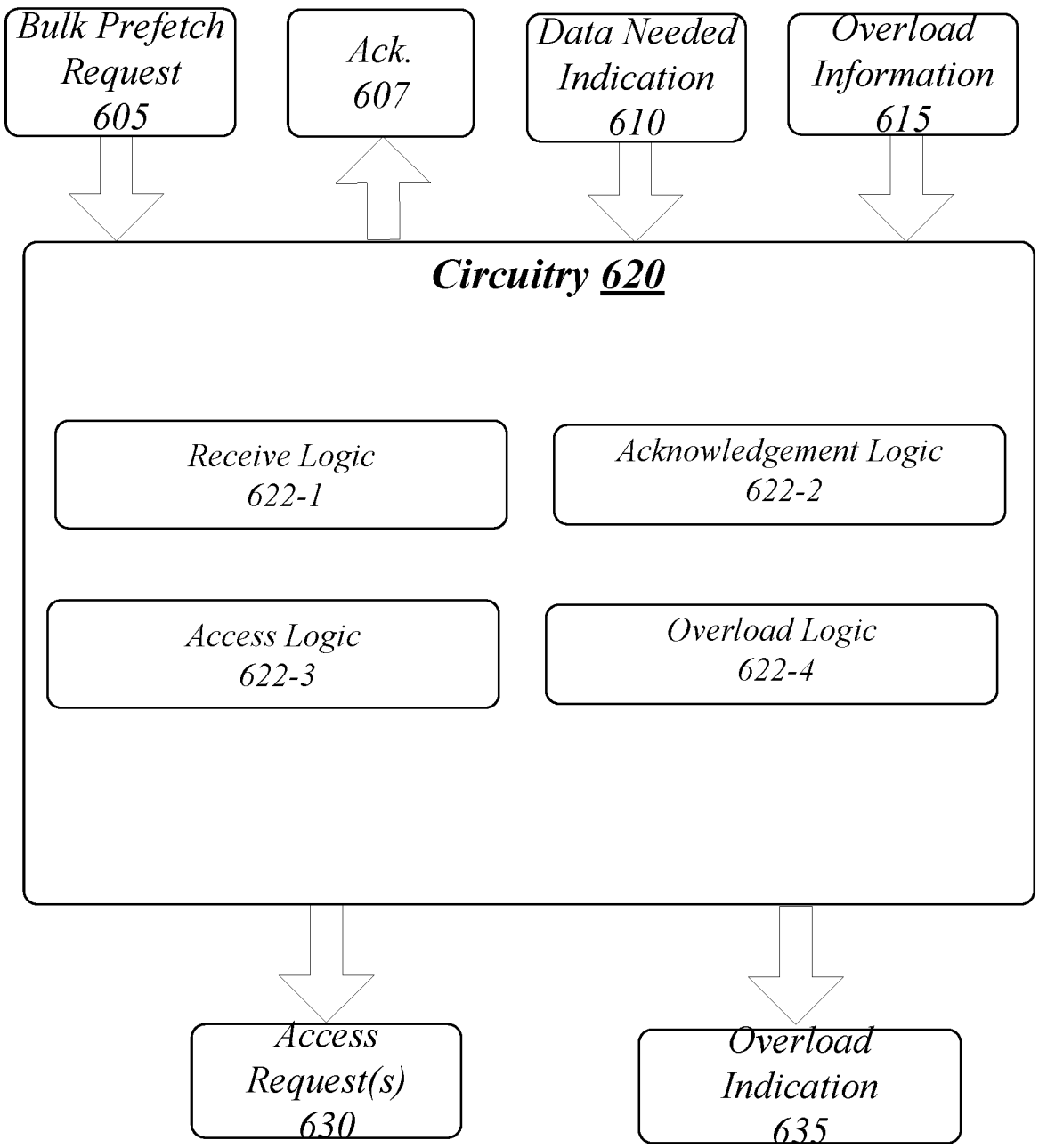
FIG. 6 illustrates an example block diagram for an apparatus.

FIG. 6 illustrates an example block diagram for apparatus 600. Although apparatus 600 shown in FIG. 6 has a limited number of elements in a certain topology, it may be appreciated that the apparatus 600 may include more or less elements in alternate topologies as desired for a given implementation.

According to some examples, apparatus 600 may be supported by circuitry 620. For these examples, circuitry 620 may be circuitry for a processor, e.g., DMA circuitry 115 as shown in FIG. 1. Circuitry 620 may be arranged to execute modules, components or logic 622-a (module, component or logic may be used interchangeably in this context) that may be wholly or at least partially implemented in hardware. It is worthy to note that "a" and "b" and "c" and similar designators as used herein are intended to be variables representing any positive integer. Thus, for example, if an implementation sets a value for a=4, then a complete set of modules, components or logic 622-a may include logic 622-1, 622-2, 622-3 or 622-4. The examples presented are not limited in this context and the different variables used throughout may represent the same or different integer values. Also, "logic", "module" or "component" may also include software/firmware stored in computer-readable media, and although types of logic are shown in FIG. 6 as discrete boxes, this does not limit these types of logic to storage in distinct computer-readable media (e.g., a separate memory, etc.).

According to some examples, as mentioned above, circuitry 620 may be circuitry for a processor. Circuitry 620 may be generally arranged to execute or implement one or more components, modules or logic 622-a. Circuitry 620 may be included in any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples, circuitry 620 may be configured as an application specific integrated circuit (ASIC) and at least some components, modules or logic 622-a may be implemented as hardware elements of the ASIC. In some examples, circuitry 620 may be configured as a field programmable gate array (FPGA) and at least some components, modules or logic 622-a may be implemented as hardware elements of the FPGA.

According to some examples, apparatus 600 may include a receive logic 622-1. Receive logic 622-1 may be executed or implemented by circuitry 620 to receive a prefetch request from a core of the processor that includes apparatus 600. For these examples, the prefetch request may be to prefetch data from a second level of memory included in a hierarchical arrangement of memory coupled with the processor. The data may be prefetched to a first level of memory included in the hierarchical arrangement of memory coupled with the processor. Also, for these examples, the prefetch request may indicate an amount of data to prefetch that is greater than a data capacity of a cache line utilized by the core. The prefetch request may be included in bulk prefetch request 605.

In some examples, apparatus 600 may include an acknowledgement logic 622-2. Acknowledgement logic 622-2 may be executed or implemented by circuitry 620 to send an acknowledgement to the core to indicate receipt of the prefetch request. For these examples, the acknowledgement may be included in acknowledgement 607.

According to some examples, apparatus 600 may also include an access logic 622-3. Access logic 622-3 may be executed or implemented by circuitry 620 to send one or more access requests to a controller of the second level of memory to cause the data indicated in the prefetch request to be stored to the first level of memory. For these examples, the one or more access requests may be included in access request(s) 630.

In some examples, apparatus 600 may also include an overload logic 622-4. Overload logic 622-4 may be executed or implemented by circuitry 620 to detect an overload condition in the hierarchical arrangement of memory that prevents prefetching of at least a portion of the data from the second level of memory to the first level of memory. For these examples, the detection of the overload condition may be based on information included in overload information 615. In some examples, overload information 615 may be sent by respective controllers for the first level of memory or the second level of memory. Overload logic 622-4 may cause an indication of the overload condition to be sent to the core that may cause the core to issue one or more cache line prefetch requests that cause a single cache line of data to be prefetched from the first level of memory for each respective cache line prefetch request in order to prefetch remaining data from the second level of memory to the first level of memory that was not prefetched following the overload condition. For these examples, the indication of the overload sent to the core may be included in overload indication 635.

According to some examples, receive logic 622-1 may receive an indication from the core that the data to prefetch from the second level of memory is needed for processing by the core before all the data has been prefetched from the second level of memory. For these examples, the indication may be included in data needed indication 610. In response to receiving the indication, access logic 622-3 may stop sending the one or more access requests to the controller of the second level of memory.

Various components, modules or logic of apparatus 600 may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Example connections include parallel interfaces, serial interfaces, and bus interfaces.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 7 illustrates an example logic flow 700. Logic flow 700 may be representative of some or all the operations executed by one or more logic, features, or devices described herein, such as apparatus 600. More particularly, logic flow 700 may be implemented by at least receive logic 622-1, acknowledgement logic 622-2 or access logic 622-3.

According to some examples, logic flow 700 at block 702 may receive, at circuitry for a processor, a prefetch request from a core of the processor, the prefetch request to prefetch data from a second level of memory included in a hierarchical arrangement of memory coupled with the processor, the data to be prefetched to a first level of memory included in the hierarchical arrangement of memory, the prefetch request to indicate an amount of data to prefetch that is greater than a data capacity of a cache line utilized by the core. For these examples, receive logic 622-1 may receive the prefetch request.

In some examples, logic flow 700 at block 704 may send an acknowledgement to the core to indicate receipt of the prefetch request. For these examples, acknowledgement logic 622-2 may send the acknowledgement.

According to some examples, logic flow 700 at block 706 may send one or more access requests to a controller of the second level of memory to cause the data indicated in the prefetch request to be stored to the first level of memory. For these examples, access logic 622-3 may send the one or more requests.

FIG. 8 illustrates an example storage medium 800. Storage medium 800 may comprise an article of manufacture. In some examples, storage medium 800 may include any non-transitory computer readable medium or machine readable medium, such as an optical, magnetic or semiconductor storage. Storage medium 800 may store various types of computer executable instructions, such as instructions to implement logic flow 700. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 9:
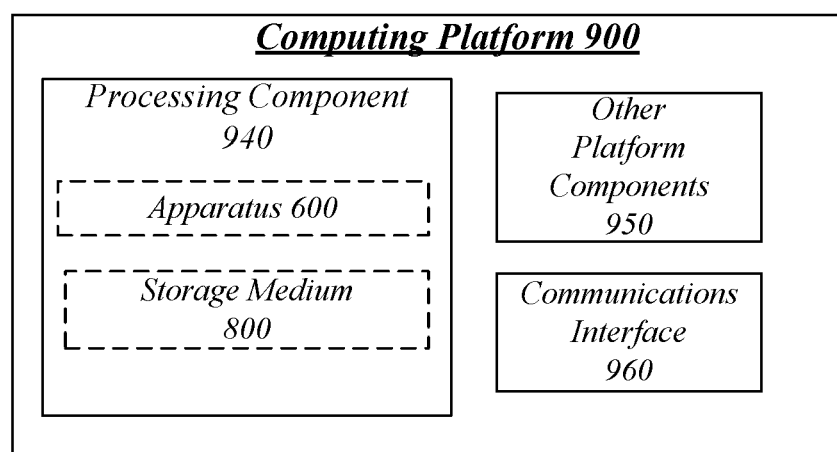
FIG. 9 illustrates an example block diagram for a computing platform.

FIG. 9 illustrates an example computing platform 900. In some examples, as shown in FIG. 9, computing platform 900 may include a processing components 940, other platform components 950 or a communications interface 960.

According to some examples, processing components 940 may execute or implement processing operations or logic for apparatus 600 and/or storage medium 800. Processing components 940 may include various hardware elements, software elements, or a combination of both. Examples of hardware elements may include devices, logic devices, components, processors, microprocessors, management controllers, companion dice, circuits, processor circuits, circuit elements (e.g., transistors, resistors, capacitors, inductors, and so forth), integrated circuits, ASICs, programmable logic devices (PLDs), digital signal processors (DSPs), FPGAs, memory units, logic gates, registers, semiconductor device, chips, microchips, chip sets, and so forth. Examples of software elements may include software components, programs, applications, computer programs, application programs, device drivers, system programs, software development programs, machine programs, operating system software, middleware, firmware, software modules, routines, subroutines, functions, methods, procedures, software interfaces, application program interfaces (APIs), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 950 may include common computing elements, memory units, chipsets, controllers, peripherals, interfaces, oscillators, timing devices, video cards, audio cards, multimedia input/output (I/O) components (e.g., digital displays), power supplies, and so forth. Examples of memory units or memory devices may include without limitation various types of computer readable and machine readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory), solid state drives (SSD) and any other type of storage media suitable for storing information.

In some examples, communications interface 960 may include logic and/or features to support a communication interface. For these examples, communications interface 960 may include one or more communication interfaces that operate according to various communication protocols or standards to communicate over direct or network communication links. Direct communications may occur via use of communication protocols or standards described in one or more industry standards (including progenies and variants) such as those associated with the PCIe specification, the NVMe specification or the I3C specification. Network communications may occur via use of communication protocols or standards such those described in one or more Ethernet standards promulgated by the Institute of Electrical and Electronics Engineers (IEEE). For example, one such Ethernet standard promulgated by IEEE may include, but is not limited to, IEEE 802.3-2012, Carrier sense Multiple access with Collision Detection (CSMA/CD) Access Method and Physical Layer Specifications, Published in December 2012 (hereinafter "IEEE 802.3 specification"). Network communication may also occur according to one or more OpenFlow specifications such as the OpenFlow Hardware Abstraction API Specification. Network communications may also occur according to one or more Infiniband Architecture specifications.

Computing platform 900 may be implemented in a server or client computing device. Accordingly, functions and/or specific configurations of computing platform 900 described herein, may be included or omitted in various embodiments of computing platform 900, as suitably desired for a server or client computing device.

The components and features of computing platform 900 may be implemented using any combination of discrete circuitry, ASICs, logic gates and/or single chip architectures. Further, the features of computing platform 900 may be implemented using microcontrollers, FPGAs and/or microprocessors or any combination of the foregoing where suitably appropriate. It is noted that hardware, firmware and/or software elements may be collectively or individually referred to herein as "logic" or "circuit."

It should be appreciated that the exemplary computing platform 900 shown in the block diagram of FIG. 9 may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" and may be similar to IP blocks. IP cores may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled" or "coupled with", however, may also mean that two or more elements are not in direct contact with each other, but yet still co-operate or interact with each other.

The follow examples pertain to additional examples of technologies disclosed herein.

Example 1

An example apparatus may include DMA circuitry used in connection with a processor, the DMA circuitry to include logic to receive a prefetch request from a core of the processor. The prefetch request may prefetch data from a second level of memory included in a hierarchical arrangement of memory coupled with the processor. The data may be prefetched to a first level of memory included in the hierarchical arrangement of memory. The prefetch request may indicate an amount of data to prefetch that is greater than a data capacity of a cache line utilized by the core. The logic may also send one or more access requests to a controller of the second level of memory to cause the data indicated in the prefetch request to be stored to the first level of memory.

Example 2

The apparatus of example 1, may also include the logic to send an acknowledgement to the core to indicate receipt of the prefetch request.

Example 3

The apparatus of example 1, the hierarchical arrangement of memory may be two level memory (2LM). The first level of memory may be coupled with the processor as a near memory and the second level of memory may be coupled with the processor as a far memory.

Example 4

The apparatus of example 1, the amount of data indicated in the prefetch request is at least 1,000 times greater than the data capacity of the cache line utilized by the core.

Example 5

The apparatus of example 1, the processor, the DMA circuitry located in an uncore portion of the processor.

Example 6

The apparatus of example 1, the logic may also detect an overload condition in the hierarchical arrangement of memory that prevents prefetching of at least a portion of the data from the second level of memory to the first level of memory. The logic may also send an indication of the overload condition to the core to cause the core to issue one or more cache line prefetch requests that cause a single cache line of data to be prefetched from the first level of memory for each respective cache line prefetch request in order to prefetch remaining data from the second level of memory to the first level of memory that was not prefetched following the overload condition.

Example 7

The apparatus of example 1, the logic may also receive an indication from the core that the data to prefetch from the second level of memory is needed for processing by the core before all of the data has been prefetched from the second level of memory. The logic may also stop the sending of the one or more access requests to the controller of the second level of memory.

Example 8

The apparatus of example 1, the first level of memory may include DRAM and the second level of memory may include a byte addressable non-volatile memory.

Example 9

The apparatus of example 8, the DRAM may be maintained on at least one DIMM.

Example 10

The apparatus of example 8, the DRAM may be arranged as high-bandwidth memory (HBM) stacked on the processor.

Example 11

The apparatus of example 8, the byte addressable non-volatile memory may include phase change memory that uses chalcogenide phase change material, flash memory, single or multi-level phase change memory (PCM), nanowire memory, ferroelectric transistor random access memory (FeTRAM), anti-ferroelectric memory, resistive memory including a metal oxide base, an oxygen vacancy base and a conductive bridge random access memory (CB-RAM), a spintronic magnetic junction memory, a magnetic tunneling junction (MTJ) memory, a domain wall (DW) and spin orbit transfer (SOT) memory, a thyristor based memory, a magnetoresistive random access memory (MRAM) that incorporates memristor technology, spin transfer torque MRAM (STT-MRAM).

Example 12

An example method may include receiving, at circuitry for a processor, a prefetch request from a core of the processor, the prefetch request to prefetch data from a second level of memory included in a hierarchical arrangement of memory coupled with the processor. The data may be prefetched to a first level of memory included in the hierarchical arrangement of memory, the prefetch request to indicate an amount of data to prefetch that is greater than a data capacity of a cache line utilized by the core. The method may also include sending one or more access requests to a controller of the second level of memory to cause the data indicated in the prefetch request to be stored to the first level of memory.

Example 13

The method of example 12 may also include sending an acknowledgement to the core to indicate receipt of the prefetch request.

Example 14

The method of example 12, the hierarchical arrangement of memory may include 2LM. The first level of memory may be coupled with the processor as a near memory and the second level of memory coupled with the processor as a far memory.

Example 15

The method of example 12, the amount of data indicated in the prefetch request may be at least 1,000 times greater than the data capacity of the cache line utilized by the core.

Example 16

The method of example 12, the circuitry for the processor may be DMA circuitry located in an uncore portion of the processor.

Example 17

The method of example 12 may also include detecting an overload condition in the hierarchical arrangement of memory that prevents prefetching of at least a portion of the data from the second level of memory to the first level of memory. The method may also include sending an indication of the overload condition to the core to cause the core to issue one or more cache line prefetch requests that cause a single cache line of data to be prefetched from the first level of memory for each respective cache line prefetch request in order to prefetch remaining data from the second level of memory to the first level of memory that was not prefetched following the overload condition.

Example 18

The method of example 12 may also include receiving an indication from the core that the data to prefetch from the second level of memory is needed for processing by the core before all of the data has been prefetched from the second level of memory. The method may also include stopping the sending of the one or more access requests to the controller of the second level of memory.

Example 19

The method of example 12, the first level of memory including DRAM and the second level of memory including a byte addressable non-volatile memory.

Example 20

The method of example 19, the DRAM may be maintained on at least one DIMM.

Example 21

The method of example 19, the DRAM may be arranged as high-bandwidth memory (HBM) stacked on the processor.

Example 22

The method of example 19, the byte addressable non-volatile memory may include phase change memory that uses chalcogenide phase change material, flash memory, single or multi-level phase change memory (PCM), nanowire memory, ferroelectric transistor random access memory (FeTRAM), anti-ferroelectric memory, resistive memory including a metal oxide base, an oxygen vacancy base and a conductive bridge random access memory (CB-RAM), a spintronic magnetic junction memory, a magnetic tunneling junction (MTJ) memory, a domain wall (DW) and spin orbit transfer (SOT) memory, a thyristor based memory, a magnetoresistive random access memory (MRAM) that incorporates memristor technology, spin transfer torque MRAM (STT-MRAM).

Example 23

An example at least one machine readable medium may include a plurality of instructions that in response to being executed by a system may cause the system to carry out a method according to any one of examples 12 to 22.

Example 24

An example apparatus may include means for performing the methods of any one of examples 12 to 22.

Example 25

An example system may include a hierarchical arrangement of memory that includes a first level of memory and a second level of memory. The system may also include a processor coupled with hierarchical arrangement of memory. The processor may include one or more cores and direct memory access circuitry. The DMA circuitry may include logic to receive a prefetch request from a core from among the one or more cores. The prefetch request may prefetch data from the second level of memory. The data may be prefetched to the first level of memory. The prefetch request may indicate an amount of data to prefetch that is greater than a data capacity of a cache line utilized by the core. The logic may also send one or more access requests to a controller of the second level of memory to cause the data indicated in the prefetch request to be stored to the first level of memory.

Example 26

The system of example 25, the logic may also send an acknowledgement to the core to indicate receipt of the prefetch request.

Example 27

The system of example 25, the hierarchical arrangement of memory includes 2LM, the first level of memory coupled with the processor as a near memory and the second level of memory coupled with the processor as a far memory.

Example 28

The system of example 25, the amount of data indicated in the prefetch request may be at least 1,000 times greater than the data capacity of the cache line utilized by the core.

Example 29

The system of example 25, the DMA circuitry may be located in an uncore portion of the processor.

Example 30

The system of example 25, the logic may also detect an overload condition in the hierarchical arrangement of memory that prevents prefetching of at least a portion of the data from the second level of memory to the first level of memory. The logic may also send an indication of the overload condition to the core to cause the core to issue one or more cache line prefetch requests that cause a single cache line of data to be prefetched from the first level of memory for each respective cache line prefetch request in order to prefetch remaining data from the second level of memory to the first level of memory that was not prefetched following the overload condition.

Example 31

The system of example 25, the logic may also receive an indication from the core that the data to prefetch from the second level of memory is needed for processing by the core before all of the data has been prefetched from the second level of memory. The logic may also stop the sending of the one or more access requests to the controller of the second level of memory.

Example 32

The system of example 25, the first level of memory may include DRAM and the second level of memory may include a byte addressable non-volatile memory.

Example 33

The system of example 32, comprising the DRAM maintained on at least one DIMM.

Example 34

The system of example 32, the DRAM may be arranged as high-bandwidth memory (HBM) stacked on the processor.

Example 35

The system of example 32, the byte addressable non-volatile memory may include phase change memory that uses chalcogenide phase change material, flash memory, single or multi-level phase change memory (PCM), nanowire memory, ferroelectric transistor random access memory (FeTRAM), anti-ferroelectric memory, resistive memory including a metal oxide base, an oxygen vacancy base and a conductive bridge random access memory (CB-RAM), a spintronic magnetic junction memory, a magnetic tunneling junction (MTJ) memory, a domain wall (DW) and spin orbit transfer (SOT) memory, a thyristor based memory, a magnetoresistive random access memory (MRAM) that incorporates memristor technology, spin transfer torque MRAM (STT-MRAM).

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
   direct memory access (DMA) circuitry used in connection with a processor, the DMA circuitry to include logic to:
      receive a prefetch request from a core of the processor, the prefetch request to prefetch data from a second level of memory included in a hierarchical arrangement of memory coupled with the processor, the data to be prefetched to a first level of memory included in the hierarchical arrangement of memory, the prefetch request to indicate an amount of data to prefetch that is greater than a data capacity of a cache line utilized by the core, the first level of memory to include dynamic random access memory (DRAM) and the second level of memory to include a byte addressable non-volatile memory; and
      send one or more access requests to a controller of the second level of memory to cause the data indicated in the prefetch request to be stored to the first level of memory.

2. The apparatus of claim 1, further comprising the logic to:
   send an acknowledgement to the core to indicate receipt of the prefetch request.

3. The apparatus of claim 1, the hierarchical arrangement of memory comprises two level memory (2LM), the first level of memory coupled with the processor as a near memory and the second level of memory coupled with the processor as a far memory.

4. The apparatus of claim 1, comprising the amount of data indicated in the prefetch request is at least 1,000 times greater than the data capacity of the cache line utilized by the core.

5. The apparatus of claim 1, further comprising the DMA circuitry located in an uncore portion of the processor.

6. The apparatus of claim 1, further comprising the logic to:
   detect an overload condition in the hierarchical arrangement of memory that prevents prefetching of at least a portion of the data from the second level of memory to the first level of memory; and
   send an indication of the overload condition to the core to cause the core to issue one or more cache line prefetch requests that cause a single cache line of data to be prefetched from the first level of memory for each respective cache line prefetch request in order to prefetch remaining data from the second level of memory to the first level of memory that was not prefetched following the overload condition.

7. The apparatus of claim 1, further comprising the logic to:
   receive an indication from the core that the data to prefetch from the second level of memory is needed for processing by the core before all of the data has been prefetched from the second level of memory; and
   stop the sending of the one or more access requests to the controller of the second level of memory.

8. The apparatus of claim 1, comprising the DRAM maintained on at least one dual in-line memory module (DIMM).

9. The apparatus of claim 1, comprising the DRAM arranged as high-bandwidth memory (HBM) stacked on the processor.

10. The apparatus of claim 1, the byte addressable non-volatile memory comprising phase change memory that uses chalcogenide phase change material, flash memory, single or multi-level phase change memory (PCM), nanowire memory, ferroelectric transistor random access memory (FeTRAM), anti-ferroelectric memory, resistive memory including a metal oxide base, an oxygen vacancy base and a conductive bridge random access memory (CB-RAM), a spintronic magnetic junction memory, a magnetic tunneling junction (MTJ) memory, a domain wall (DW) and spin orbit transfer (SOT) memory, a thyristor based memory, a magnetoresistive random access memory (MRAM) that incorporates memristor technology, or spin transfer torque MRAM (STT-MRAM).

11. A method comprising:
   receiving, at circuitry for a processor, a prefetch request from a core of the processor, the prefetch request to prefetch data from a second level of memory included in a hierarchical arrangement of memory coupled with the processor, the data to be prefetched to a first level of memory included in the hierarchical arrangement of memory, the prefetch request to indicate an amount of data to prefetch that is greater than a data capacity of a cache line utilized by the core, the first level of memory including dynamic random access memory (DRAM) and the second level of memory including a byte addressable non-volatile memory; and
   sending one or more access requests to a controller of the second level of memory to cause the data indicated in the prefetch request to be stored to the first level of memory.

12. The method of claim 11, further comprising:
   sending an acknowledgement to the core to indicate receipt of the prefetch request.

13. The method of claim 11, the hierarchical arrangement of memory comprises two level memory (2LM), the first level of memory coupled with the processor as a near memory and the second level of memory coupled with the processor as a far memory.

14. The method of claim 11, comprising:
   detecting an overload condition in the hierarchical arrangement of memory that prevents prefetching of at least a portion of the data from the second level of memory to the first level of memory; and
   sending an indication of the overload condition to the core to cause the core to issue one or more cache line prefetch requests that cause a single cache line of data to be prefetched from the first level of memory for each respective cache line prefetch request in order to prefetch remaining data from the second level of memory to the first level of memory that was not prefetched following the overload condition.

15. The method of claim 11, comprising:
receiving an indication from the core that the data to prefetch from the second level of memory is needed for processing by the core before all of the data has been prefetched from the second level of memory; and
stopping the sending of the one or more access requests to the controller of the second level of memory.

16. A system comprising:
a hierarchical arrangement of memory that includes a first level of memory and a second level of memory; and
a processor coupled with hierarchical arrangement of memory, the processor to include one or more cores and direct memory access circuitry, the DMA circuitry to include logic to:
receive a prefetch request from a core from among the one or more cores, the prefetch request to prefetch data from the second level of memory, the data to be prefetched to the first level of memory, the prefetch request to indicate an amount of data to prefetch that is greater than a data capacity of a cache line utilized by the core, the first level of memory to include dynamic random access memory (DRAM) and the second level of memory to include a byte addressable non-volatile memory; and
send one or more access requests to a controller of the second level of memory to cause the data indicated in the prefetch request to be stored to the first level of memory.

17. The system of claim 16, the hierarchical arrangement of memory comprises two level memory (2LM), the first level of memory coupled with the processor as a near memory and the second level of memory coupled with the processor as a far memory.

18. The system of claim 16, comprising the DMA circuitry located in an uncore portion of the processor.

19. The system of claim 16, further comprising the logic to:
detect an overload condition in the hierarchical arrangement of memory that prevents prefetching of at least a portion of the data from the second level of memory to the first level of memory; and
send an indication of the overload condition to the core to cause the core to issue one or more cache line prefetch requests that cause a single cache line of data to be prefetched from the first level of memory for each respective cache line prefetch request in order to prefetch remaining data from the second level of memory to the first level of memory that was not prefetched following the overload condition.

20. The system of claim 16, further comprising the logic to:
receive an indication from the core that the data to prefetch from the second level of memory is needed for processing by the core before all of the data has been prefetched from the second level of memory; and
stop the sending of the one or more access requests to the controller of the second level of memory.

21. The system of claim 16, comprising the DRAM maintained on at least one dual in-line memory module (DIMM).

22. The system of claim 16, comprising the DRAM arranged as high-bandwidth memory (HBM) stacked on the processor.

* * * * *